United States Patent [19]
Strickland et al.

[11] Patent Number: 5,751,823
[45] Date of Patent: May 12, 1998

[54] AUDIO AMPLIFIER SYSTEM WITH IMPROVED ISOLATION BETWEEN PREAMPLIFIER AND POWER AMPLIFIER

[75] Inventors: James C. Strickland; Mark D. Albers, both of Mesa, Ariz.

[73] Assignee: Rockford Corporation, Tempe, Ariz.

[21] Appl. No.: 582,367

[22] Filed: Jan. 5, 1996

[51] Int. Cl.⁶ .................. H04B 15/00; H03F 3/04
[52] U.S. Cl. .................. 381/94.6; 381/120; 381/121; 330/297; 330/267; 330/202
[58] Field of Search .................. 381/120, 121, 381/94.6; 330/202, 267, 273, 297, 298

[56] References Cited

U.S. PATENT DOCUMENTS 4,517,528  5/1985  Tanaka et al. .................. 330/297
4,979,218  12/1990  Strahm .................. 381/94.6
5,170,081  12/1992  Adachi et al. .................. 381/94.6
5,517,572  5/1996  Heyl .................. 381/94.6
5,610,555  3/1997  Funahashi et al. .................. 381/121

*Primary Examiner*—Curtis Kuntz
*Assistant Examiner*—Xu Mei
*Attorney, Agent, or Firm*—Warner Norcross & Judd

[57] ABSTRACT

An audio amplifier, particularly suited for automotive applications, providing improved isolation between the preamplifier section and the power amplifier section. The preamplifier section ground is isolated from the power amplifier section ground. The amplifier includes a voltage regulator with output feedback for supplying a regulated voltage to the preamplifier section. The voltage regulator is referenced to the preamplifier section ground.

7 Claims, 5 Drawing Sheets

AUDIO AMPLIFIER SYSTEM WITH IMPROVED ISOLATION BETWEEN PREAMPLIFIER AND POWER AMPLIFIER

BACKGROUND OF THE INVENTION

The present invention relates to audio amplifiers, and more particularly to noise reduction in interconnections between preamplifiers and power amplifiers.

Automotive sound systems present difficult signal transmission problems due to the electrical noise potentials (i.e. unwanted voltages) generated in the vehicle chassis by the many electrical systems distributed throughout the vehicle. In sophisticated audio systems, the audio amplifiers are typically mounted at some distance (e.g. the vehicle trunk) from the dash-mounted head unit or source unit of the sound system. The amplifiers are typically grounded locally to the vehicle chassis.

As a result of grounding the audio amplifiers to the vehicle chassis, there are almost always serious noises voltages present between the source unit and the amplifier. The noise problem is further complicated by the common preference for the use of coaxial shielded cables employing the world-standard RCA connector. Any noise present due to the difference in electric potential between the amplifier ground, located in the trunk, and the signal source ground, located at the front of the car, will be picked up as noise by the RCA cable.

There are three commonly used methods for minimizing interconnection noise on such cables. Each of these methods is based on using subtractive techniques to minimize the intrusion of the shield-drop noise signals due to the difference in electric potential between the respective grounds in the trunk and the hood. Subtractive techniques utilize the properties of a circuit in an attempt to cancel out any unwanted noise voltages present in the system. An indispensable element of success for any subtractive technique is the absolute minimization of any noise voltages present in the shield or outer portion of the coaxial cable.

The first noise reduction technique isolates the total amplifier grounding system from the vehicle grounding system. As shown in FIG. 1, this system employs a digital isolator element and an analog isolator element to completely isolate the entire amplifier system from the power supply. This system then employs step-up transformers to convert the voltage present in the audio power supply to the higher plus/minus rail voltages necessary to provide power to the elements of the amplifier circuit.

There are three disadvantages in this approach. First, there are numerous command and control signals which must pass between the vehicle ground and the isolated power ground of the audio amplifier. Optical, magnetic or other known isolation techniques are therefore needed. Second, noise generated by the switching power supplies capacitively couples to the amplifier chassis and the ground system. This noise current then appears back into the RCA cable shield degrading the sound quality. Third, any short circuit to the vehicle ground of a high-powered audio output lead can cause currents of destructive amperage to appear, resulting in serious damage to amplifier front ends, the RCA cable, and the grounding system of the source unit.

The second technique for reducing noise is known as individual differentialized input ports and is illustrated in FIG. 2. This technique uses a bridge to establish a balanced input for each channel of the amplifier. A bridge is a network of usually four components (e.g. resistors) connected so that an input signal can be applied across the bridge and an output signal taken such that the output point is at the same potential as the input. This removes unwanted noise voltages from the amplifier. However, the subtraction of the noise voltages that result from this solution is only as good as the bridge balance determined by the tolerance of the four bridge resistors in the differential amplifier portion of the circuit.

This second technique also has disadvantages. The first relates to common mode rejection. Standard resistors are manufactured to a tolerance of 1%—that is, the resistor values will be accurate to within 1% of the nominal value. However, standard 1% resistors will yield a common mode rejection ratio (CMRR) no better than 28 dB which does not provide sufficient noise minimization. A differential amplifier amplifies the difference in the voltages applied to its input ports by the gain of the amplifier. Common mode rejection is the extent to which the differential amplifier will reject a signal presented simultaneously to both inputs of the amplifier. The common mode rejection ratio measures the extent to which the differential amplifier cancels any undesirable signals. It is the ratio of the differential gain of the amplifier to the common mode gain of the amplifier. In differential amplifiers, the common mode gain ideally is extremely low. Thus, the ratio of the differential gain to the common mode gain should be as large as possible to effectively cancel out undesirable noise signals. The CMRR is also a function of frequency, decreasing as the frequency is increased. At the noise frequencies common in an automotive audio environment, the CMRR of operational amplifiers is not as high as desired. Further, the extra stages added for each channel contribute additional cost, complexity, and sonic degradation to the amplifier system.

The third, and presently most common, technique, creates a separate grounding system for only the preamplifier section of the amplifier system. This isolation approach has long been used in home amplifiers and is shown in FIG. 3. The preamplifier section enhances the sensitivity of the radio receiver. The power amplifier section delivers the power necessary to drive the speakers. In this third technique, the preamplifier section is electrically isolated by an impedance from the power amplifier ground, which is tied to the 12-volt vehicle ground. If this high impedance can be maintained, the relatively low resistance (typically less than 0.1 ohms) of the coaxial shield of the RCA cable will be able to establish essentially an equipotential situation between the grounds. If each ground is at the same potential or voltage, no current will flow into the cable shield and the unwanted noise will be eliminated. Having the grounds at equal potentials limits the shield-drop noise potential to typically 80 dB below the potential drop between the amplifier unit and the source unit in an unisolated circuit. If the potential drop is limited to 80 dB, the amplifier is effectively isolated; and any noise is effectively eliminated from the output.

Typically, this impedance is provided by way of a resistor (e.g. 1000 ohms). However, the actual isolation impedance is found to be as much as thirty to one hundred times less than the intended isolation; and isolation therefore is lost. This unexpected loss has been discovered to be caused by the parasitic paths inherent to power distribution practices which show up only on an alternating current (AC) impedance test and not on a direct current (DC) ohmmeter test. FIG. 4 illustrates how the parasitic path problem decreases the intended isolation impedance. Multiple resistance-capacitance (RC) decoupling networks are required to distribute low voltage rail power to the operational amplifiers in the preamplifier section of the circuit. Voltage regulators for this purpose are conventionally referenced to the 12-volt power ground. Therefore, the outputs of the voltage regulators are characterized by an extremely low impedance to this power ground. As a result of this low impedance, any noise present on the power-section ground with respect to the isolated preamplifier ground is exactly replicated on the regulator outputs. The regulators simply allow any unwanted noise voltages to pass through to the preamplifier section. These noise signals then pass through the multiple, paralleled RC decoupling networks back to the isolated ground of the preamplifier section. This results in a situation where the circuit behaves as if each of these RC networks were placed directly in parallel with the intended isolation resistor. This causes the intended isolation resistance to be thirty to one hundred times less than the intended 1,000 ohm value.

SUMMARY OF THE INVENTION

The aforementioned problems are overcome by the present invention which provides an amplifier circuit with improved isolation between the preamplifier section and the power amplifier section. The reference ground for the preamplifier voltage regulator is the isolated ground of the preamplifier section. The output of the preamplifier voltage regulator supplies rail power to the amplifiers in the preamplifier section. The output of the voltage regulator is the feedback for the reference port of the voltage regulators, establishing unity positive feedback. The circuit greatly reduces noise in the parasitic paths of the voltage regulation system, improving the isolation of the preamplifier ground system.

These and other objects, advantages, and features of the invention will be more readily understood and appreciated by reference to the detailed description of the preferred embodiment and the drawings.

DETAILED DESCRIPTION OF THE PREFERRED EMBODIMENT

Figure 5:
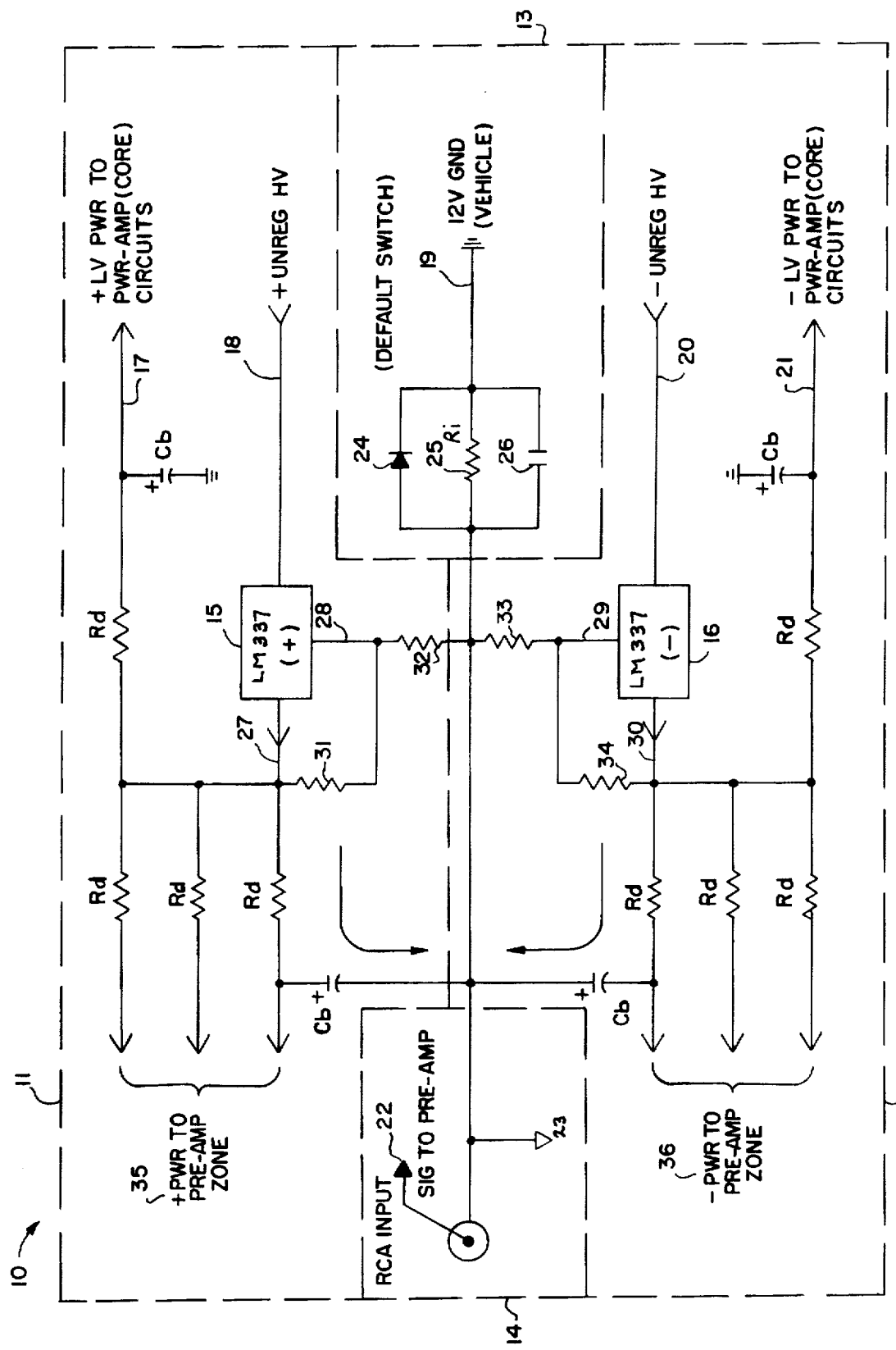
FIG. 5 is a circuit diagram of the voltage regulator of the present invention.

A voltage regulator for an audio amplifier constructed in accordance with a preferred embodiment of the invention is illustrated in FIG. 5 and generally designated 10. The regulator includes a positive voltage regulation system 11, a negative voltage regulation system 12, an isolation system 13, and an input cable connection 14.

Figure 1:
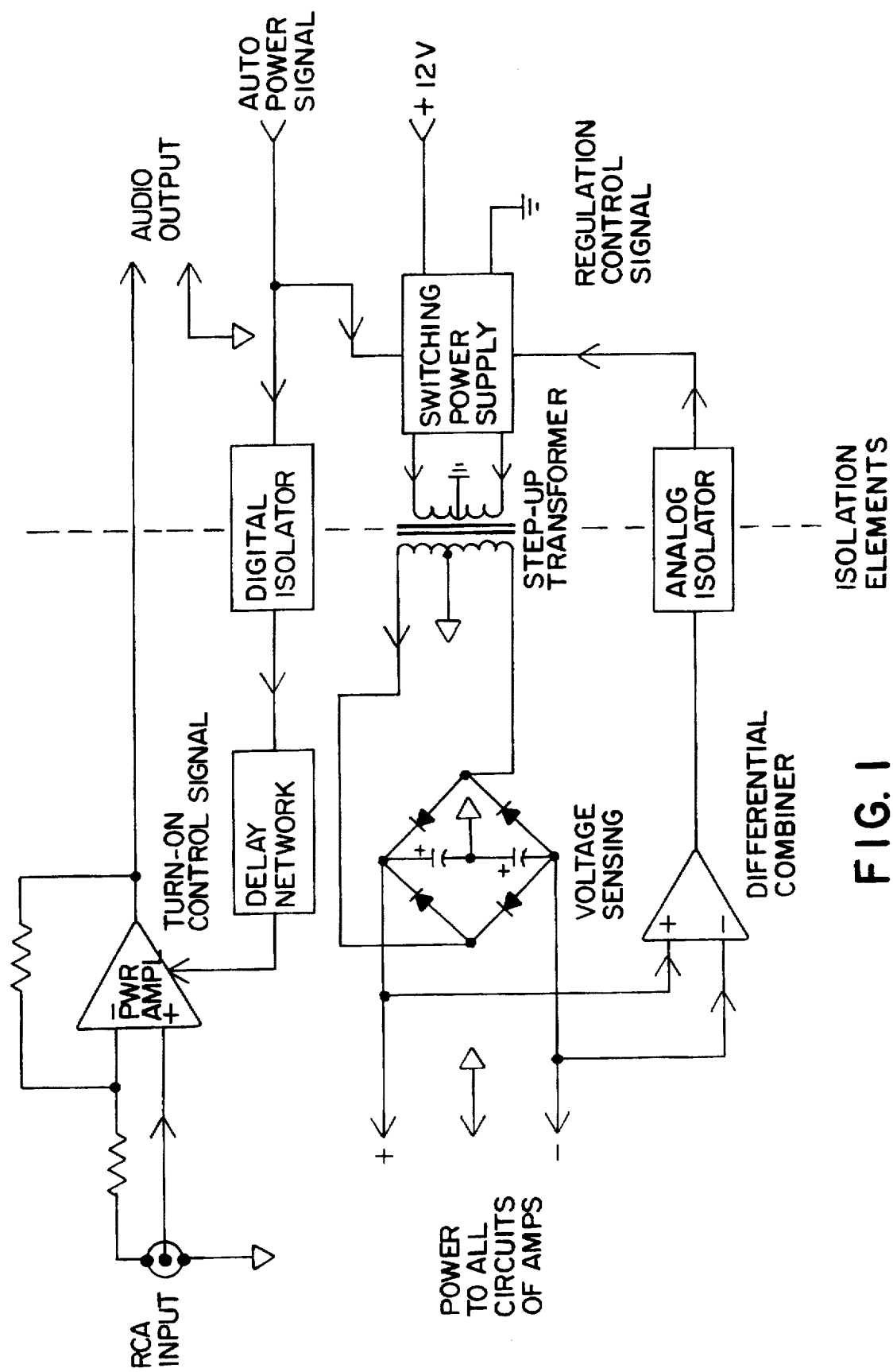
FIG. 1 is a circuit diagram of a prior art audio amplifier using total amplifier ground isolation.
Figure 2:
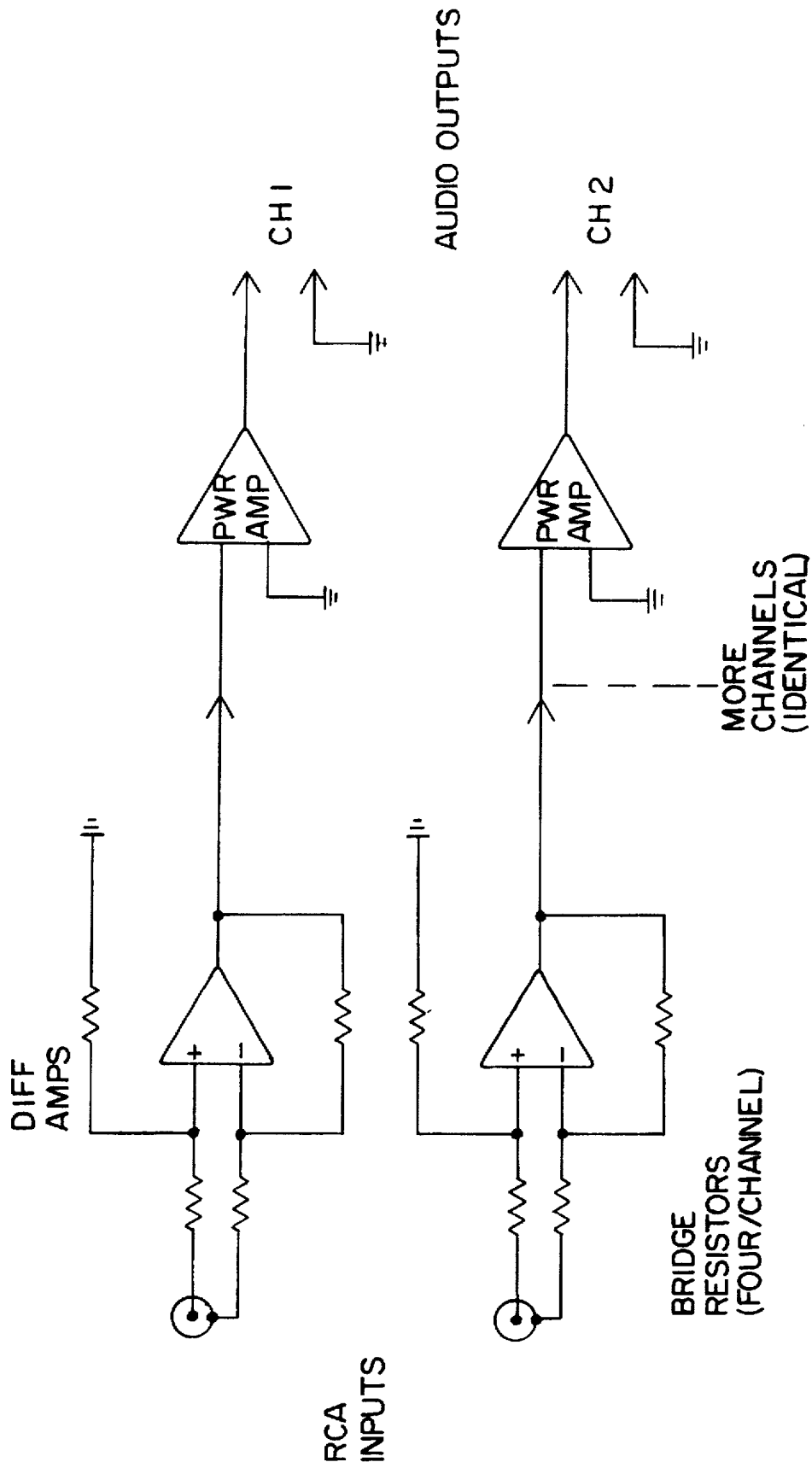
FIG. 2 is a circuit diagram of a prior art audio amplifier using individually differentialized input port isolation.
Figure 3:
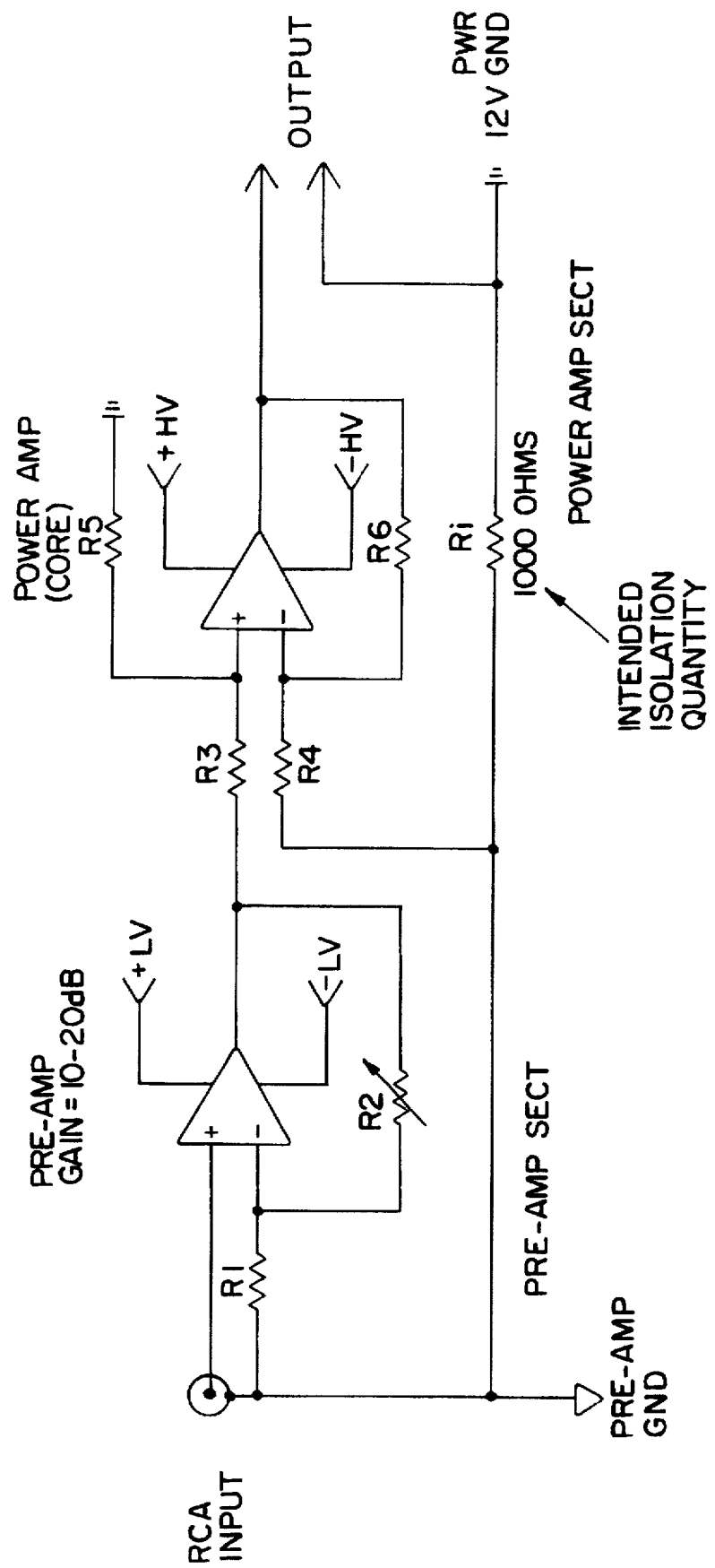
FIG. 3 is a circuit diagram of a prior art audio amplifier using isolated preamplifier grounding system.
Figure 4:
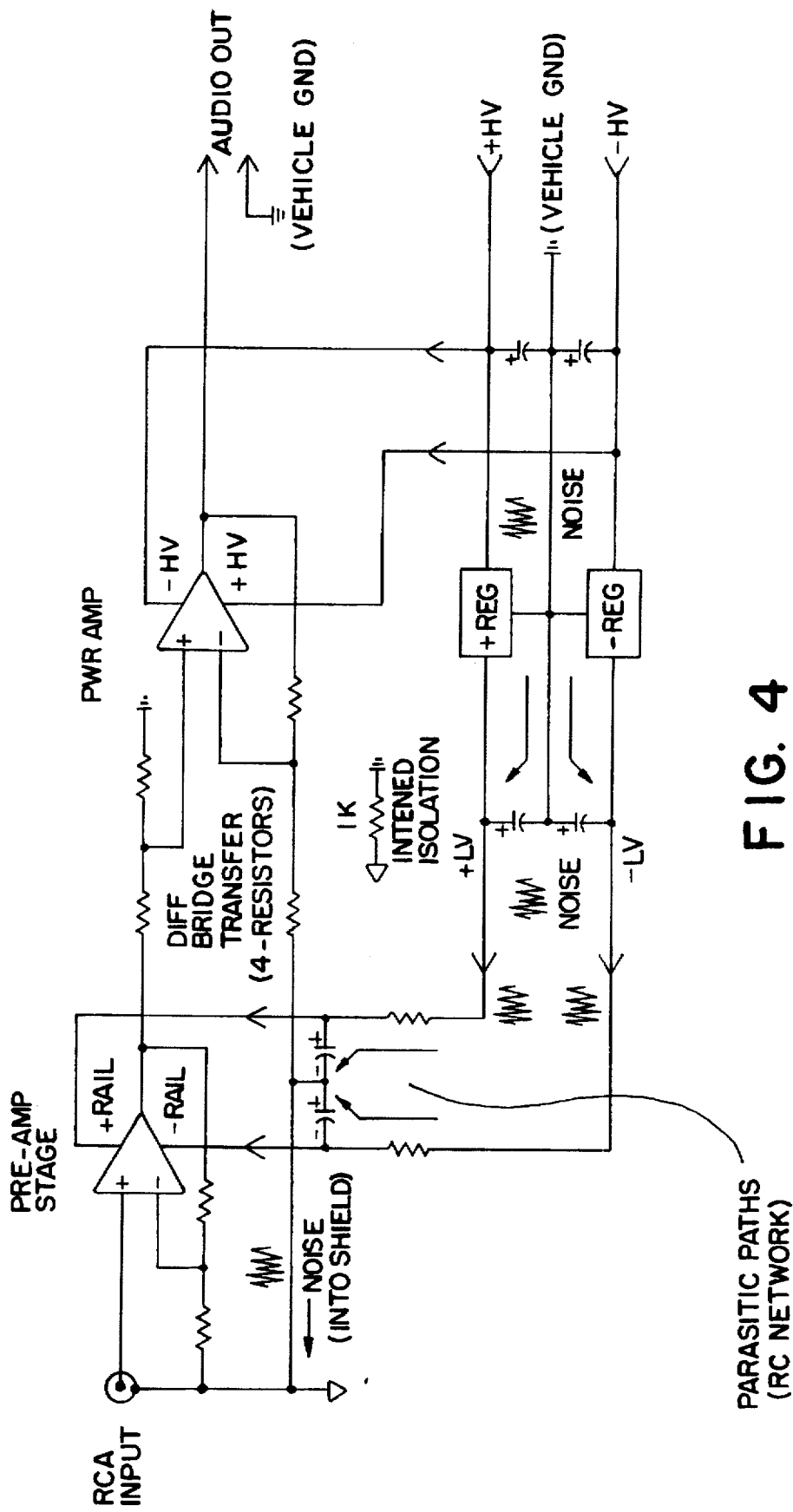
FIG. 4 is a circuit diagram of a prior art voltage regulation system for the isolated preamplifier grounding system illustrated in FIG. 4.

The present invention is used in place of the traditional voltage regulation system shown in FIG. 4. Consequently, only the new voltage regulator is illustrated in FIG. 5. All other components of the audio amplifier system are as illustrated in FIG. 4.

The present invention references the positive and negative voltage regulators to the isolated ground of the preamplifier section. The regulation reference point for the voltage regulators is effectively controlled by the outputs of the regulators themselves. The circuit includes near unity positive feedback with the exact value depending on the impedance between the isolated ground and the power ground. The positive feedback configuration essentially solves the parasitic path problem.

The positive voltage regulation system 11 includes a voltage regulator 15, output resistors Rd, capacitors Cb, and resistors 31 and 32. The voltage regulator 15 has a first input 18 connected to the unregulated power supply voltage and a second reference input 28 for the unity positive feedback. The output 27 of the voltage regulator supplies positive rail voltage 35 to the differential amplifier in the preamplifier section through the output resistors Rd.

The negative voltage regulation system 12 essentially mirrors the positive system 11. The negative voltage system includes a voltage regulator 16, output resistors Rd, capacitors Cb, and resistors 33 and 34. Unregulated power supply voltage is connected to a first input 20 of the negative voltage regulator 16. The output 30 of the negative voltage regulator 16 is returned as positive feedback at the second reference input port 29. The output 30 also provides negative rail voltage 36 to the differential amplifiers of the preamplifier section through the output resistors Rd. Both the positive and negative voltage regulatory systems 11 and 12 include an RC decoupling/bypass network to distribute the low voltage rail power to the amplifier of the preamplifier section. Each decoupling/bypass network includes a capacitor Cb and a resistor Rd connected in series between the voltage regulator output and ground.

The RCA cable connection to the preamplifier section is generally designated 14. The shield portion of the coaxial cable is connected to the isolated ground 23, which is isolated from the power ground 19. The signal to be amplified is carried by the RCA cable 22 and fed to the differential amplifier of the preamplifier section.

To provide stability, a diode 24, acting as a default switch, is connected in parallel with the isolation resistor 25 and capacitor 26 to shunt excess current across the isolation resistor and into the power ground 19.

Operation

The reference voltage for each voltage regulator 15 and 16 is dependent on the isolated preamplifier ground 23 and not the power ground 19. The output of each voltage regulator 27 and 30 is fed back to the reference input port 28 and 29 in a unity positive feedback configuration.

The operation of the positive half of the circuit will be described. Identical operation will occur in the negative half circuit of the voltage regulation system 11. The unregulated power supply voltage enters the voltage regulator at the first input port 18. The regulator operates like a tracking system; that is, the voltage out of the regulator 27 follows the voltage entering the regulator at 18. The tracking ratio of the positive voltage regulator 15 defines how the voltage out of the regulator at 27 has changed as compared to the voltage into the regulator at 18. The tracking ratio is approximately 0.99 for the industry standard voltage regulators (LM317 and LM337). This means that the regulator's output 27 will change 0.99 of the change of the input 18. Thus, there is a residual difference signal of 1% between the input and output changes of the voltage regulator 15. Since the voltage regulator 15 is referenced to the isolated ground 23 rather than the power ground 19, the residual difference signal between the input and output changes is all that appears across the RC parasitic path networks defined by Cb and Rd. Thus, the noise currents in the RC parasitic path networks are reduced by the tracking ratio of the voltage regulator 15 for any given input noise voltage. This translates to having effectively raised or multiplied the impedance of the RC network by a similar factor.

However, even with this increase in the impedance of the RC network any bypass capacitors connected directly across the output 27 to the input 18 of the voltage regulator 15 would result in a significant loss of the isolation of the preamplifier section at higher audible frequencies. This is due to the extremely low reactance—the portion of circuit impedance corresponding to the capacitors—presented by the bypass capacitors at these higher audible frequency. Thus, the regulator 15 must provide a stable voltage without output bypassing due to capacitors directly across the output/input path of the regulator 15.

The default switch 24 provides circuit stability. When the isolated ground is allowed to float (i.e. during amplifier cable connection), the amplifier without the switch would experience significant current flow from the unregulated power supply inputs 18 and 20 due to the positive feedback in each voltage regulator 15 and 16. To avoid these potentially destructive currents, the diode 24 acts as a switch to shunt excess current across the isolation resistor 25 and into the power ground 19. When choosing values for the regulator resistors 31, 32, 33, and 34 provisions must be made to cause the positive regulator 15 to inject more reference-divider current into the isolated ground 23 than the negative voltage regulator 16. This excess current raises the anode potential of the diode with respect to the power ground 19 if the isolated ground 23 is disconnected. Thus, when the isolated ground 23 is disconnected, the excess current turns on the diode and allows the potentially destructive currents resulting from the positive feedback to flow through the diode 24 and into the power ground 19. The diode 24 also allows the power ground on the amplifier to go positive with respect to the isolated ground 23 without turning on the diode.

The system behavior is defined by the tracking ratio of the voltage regulators. The tracking ratio measures how the regulators' output changes when compared to a change in the regulators' input. Any difference in signal between the output and the input of each voltage regulator is what will appear across the RC parasitic path networks. The closer the tracking ratio is to one, the less difference between the outputs and inputs of the voltage regulators and the less noise that will be transferred into the preamplifier ground. The unity positive feedback system, thus effectively raises or multiplies the impedance of the RC parasitic path networks by a factor derived from the tracking ratio of the voltage regulator devices. This results in establishing the intended isolation of the preamplifier ground from the power ground and thereby dramatically reduces the noise present in the amplifier circuit.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. An audio amplifier comprising:
   a preamplifier means for amplifying an input signal to provide a preamplified signal, said preamplifier means including a preamplifier ground;
   a power amplifier means for amplifying the preamplified signal to provide an output signal, said power amplifier means including a power amplifier ground, said preamplifier ground being isolated from said power amplifier ground;
   a voltage regulator means for supplying regulated voltage to said preamplifier means, said voltage regulator means being grounded to said preamplifier ground, said voltage regulator means including an output and a reference port, said output providing unity positive feedback to said reference port.

2. An amplifier as defined in claim 1 further comprising an isolation resistor connected between said preamplifier means and said power amplifier means.

3. An audio amplifier comprising:
   a power amplifier grounded to a power ground;
   a preamplifier grounded to a preamplifier ground isolated from said power ground;
   a voltage regulator providing regulated voltage to said preamplifier, said voltage regulator grounded to said preamplifier ground, said voltage regulator including an output and a reference port, said output providing unity positive feedback to said reference port.

4. An amplifier as defined in claim 3 further comprising a diode connected between said preamplifier ground and said power ground for shunting excess current from said preamplifier ground to said power ground.

5. An audio amplifier comprising:
   preamplifier and amplifier grounds;
   isolation means for electrically isolating said preamplifier ground from said amplifier ground;
   preamplification means for amplifying an input signal to provide a preamplified signal, said preamplification means grounded to said preamplifier ground;
   power amplification means for amplifying the preamplified signal to provide an output signal, said power amplification means grounded to said amplifier ground;
   voltage regulator means for supplying a regulated voltage to said preamplification means, said voltage regulator means including an input port, a reference port, and an output port; and
   feedback means for connecting said output port to said reference port of said voltage regulator means to provide unity positive feedback to said reference port.

6. An audio amplifier as defined in claim 5 wherein said preamplification means is a preamplifier, and said power amplification means is a power amplifier.

7. An audio amplifier as defined in claim 5 wherein said isolation means includes a diode connected between said preamplifier ground and said amplifier ground for shunting excess current.

* * * * *